Jan. 31, 1967 J. POLICHETTE 3,301,175

METHOD AND APPARATUS FOR PRINTING ON ELECTRICAL CONDUCTOR DEVICES

Filed July 15, 1964

INVENTOR
JOSEPH POLICHETTE
BY
Morgan, Finnegan, Durham & Pine
ATTORNEYS

United States Patent Office 3,301,175

Patented Jan. 31, 1967

3,301,175

METHOD AND APPARATUS FOR PRINTING ON ELECTRICAL CONDUCTOR DEVICES

Joseph Polichette, South Farmingdale, N.Y., assignor to Process Research Company, Glen Cove, N.Y., a partnership Filed July 15, 1964, Ser. No. 382,849
6 Claims. (Cl. 101—41)

Figure 1:
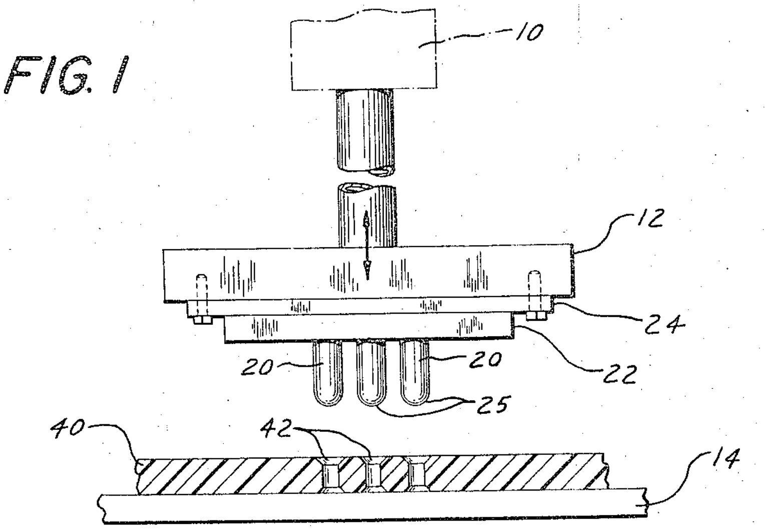

This invention relates generally to novel and improved methods and apparatus for printing adhesive material such as adhesive resinous inks onto insulating surfaces.

More particularly, this invention relates to novel methods and apparatus for printing conductive or catalytically active, adhesive resinous inks in holes or apertures which are surrounded by insulating or non-conductive surfaces.

Although the printing methods and apparatus to be described may be used to print ink of the type described in holes or apertures of any size or shape in insulating substrates, they are especially applicable in printing with catalytic ink through-holes which have a countersunk or conical-shaped appearance adjacent at least one surface of an insulating base.

Further, although applicable whenever it is desired to adhere conductive or catalytic ink to insulating surfaces surrounding holes or apertures in substrates as, for example, to render such apertures electrically conductive, the procedures and apparatus disclosed herein are particularly useful in making conductive passageways, or plated through-holes, in insulating substrates whose surface or surfaces are provided with electrically conducting patterns, e.g., printed circuit boards.

Accordingly, although the invention will be described with particular reference to making plated through-holes in printed circuit boards, and although fabrication of printed circuits constitutes a primary and preferred application, it will be understood that the invention is not limited to printed circuits but is generally applicable to rendering passageways in insulating substrates conductive.

An insulating base member to be formed into a printed circuit member is ordinarily provided with an adherent conductive pattern on both surfaces, and conductive patterns on the separated surfaces are interconnected at predetermined points (i.e., crossovers) by conductive areas which pass through one or more holes or apertures in the insulating base member. Alternatively, a conductive pattern may be provided on only one surface of the insulating member, and conductive holes or apertures provided in the insulating base to receive conductor leads from an external source.

In either case, where the holes or apertures have a countersunk appearance near the top or bottom surface of the base member, the conductive pattern on the surface of the base member often does not adhere to the countersunk portions of the lateral walls surrounding the holes or apertures, particularly where the holes are of small diameter. This is so, for example, in conventional silk screen printing, where a stenciled screen is placed over the base plate or circuit board and the conductive ink printed onto the board by drawing a rubber squeegee across the screen having a quantity of ink thereon, thereby forcing the ink through the open pattern of the screen. As stated, when the through-holes are small, screen printing leaves a very weak print or none at all on the countersunk portions or lands surrounding the holes or apertures. This in turn leads to breaks or interruptions in the circuitry in the vicinity of the lands.

It is an object of this invention to provide means and techniques for printing a conductive or catalytic ink on insulating surfaces surrounding holes or apertures formed in an insulating member, to render such surfaces conductive or to prepare such surfaces to be made conductive.

A further object of this invention is to provide means and techniques for printing a plurality of pre-arranged apertures in an insulating member with a conducting or catalytic ink so as to render the surfaces surrounding the apertures conductive or to prepare such surfaces to be made conductive.

Another object of this invention is to print a plurality of pre-arranged through-hole connections in a printed circuit board with a conductive or catalytic ink so as to simultaneously render the surfaces surrounding the apertures conductive or to simultaneously prepare such surfaces to be made conductive, as by the subsequent deposition thereon of electroless metal.

A further object of this invention is to provide a printing technique for printing conductive or catalytic ink in the countersunk lands surrounding a pre-arranged pattern of through-holes in an insulating printed circuit board so as to provide or as a preparation to providing electrical connection to and from the printed circuit pattern including electrical connection to external circuit components and/or electrical power sources, and/or other printed circuit patterns.

A further object of this invention is to simultaneously print a conductive or catalytic material on surfaces surrounding the pre-arranged through-holes in an insulating printed circuit board as a separate step from the printing of the conductive pattern on the board.

A still further object of the invention is to print on insulating surfaces surrounding pre-arranged through-holes in an insulating member by transferring a conductive or catalytic material from pre-arranged printing members whose end portions are shaped to conform to the contour of the through-holes, thereby printing the conductive or catalytic material on the periphery of the holes.

Other objects and advantages of the invention are set forth in the description which follows, and in part will be obvious therefrom, or may be learned by practice of the invention, the same being realized and attained by means of the steps, processes, instrumentalities and combinations particularly pointed out in the appended claims.

Briefly described, the present invention is directed towards a novel method and apparatus for printing ink on insulating surfaces surrounding a plurality of pre-arranged holes or apertures formed in an insulating or non-conductive member which surfaces are countersunk adjacent the surfaces of the insulating member on which a conductive pattern is provided. This method and apparatus comprises providing a plurality of pre-arranged printing members for printing the ink on the periphery of the countersunk insulating surfaces, as a separate step from the printing of the conductive pattern on the planar surface or surfaces of the insulating member. The countersunk lands are generally of a circular configuration, and in such case, the printing members may comprise either ball bearings or cylindrical pins whose tips are semispherically shaped. In either embodiment, the balls or pins are mounted on the underside of an upper platen of a bellows press. A plate containing a quantity of the ink is placed beneath the upper platen and the ink is transferred from the plate to the balls or pins by lowering the upper press platen until the balls or pins contact the plate and are coated with the ink. The plate is then removed and an insulating base member, having a plurality of pre-arranged apertures substantially corresponding to that of the printing members, each of the apertures being surrounded by countersunk insulating surfaces, is placed on a bottom platen of the bellows press beneath the upper press platen in a predetermined position so that the printing members and apertures are substantially aligned. The upper press platen is then lowered again until the coated balls or pins contact the countersunk through-holes, thereby transferring the ink onto the countersunk surfaces.

The invention consists in the novel steps, processes, parts, constructions, arrangements, combinations, and improvements herein shown and described.

It will be understood that the foregoing general description and the following detailed description as well are exemplary and explanatory of the invention but are not restrictive thereof.

The accompanying drawings, referred to herein and constituting a part hereof, illustrate preferred embodiments of the invention, and together with the description, serve to explain the principles of the invention.

Figure 2:
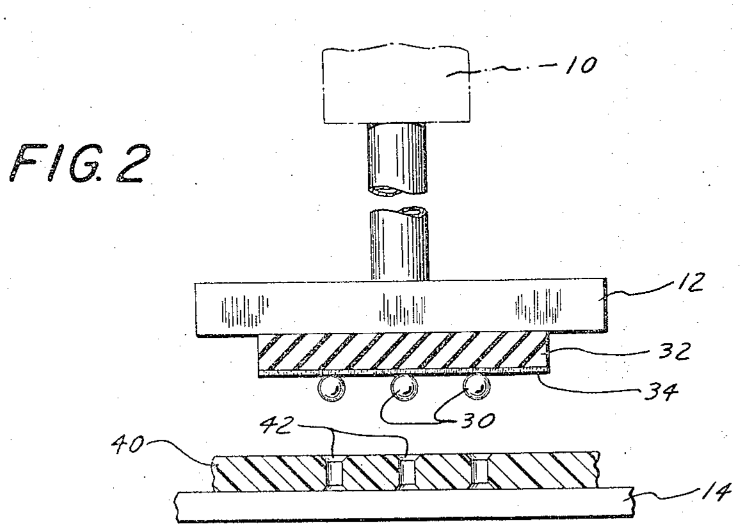
Figure 3:
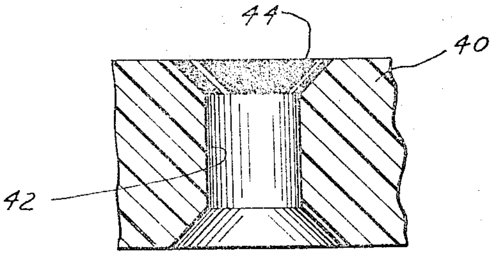

On the drawings:

FIGURE 1 is a schematic illustration, partly in side elevation, of a first embodiment of an apparatus according to the invention, with an insulating or non-conducting member in section illustrating the countersunk appearance of the holes or apertures located therein;

FIGURE 2 is a schematic, partly in side elevation, of a second embodiment of an apparatus according to the invention, with the insulating member in section as shown in FIGURE 1; and FIGURE 3 is an enlarged fragmentary cross-sectional view illustrating a hole or aperture in an insulating base member whose countersunk portions have been printed with a conductive or catalytic ink, in accordance with the invention.

Referring now more particularly to the embodiment of the invention illustrated in FIGURE 1 of the accompanying drawings, there is shown a press 10, illustrated schematically, having an upper platen 12 which may be raised and lowered, more fully described hereinbelow. The press 10 may be of any conventional type, and it has been found that a conventional bellows press operates satisfactorily. A stationary bottom platen 14 is positioned directly beneath the upper platen 12.

In accordance with the invention, means are provided for printing a conductive or catalytic ink on the countersunk portions or lands of the lateral insulating surfaces surrounding the holes or apertures of an insulating member. As here preferably embodied this means comprises a plurality of cylindrical pins 20 mounted onto panel section 22 of plate 24. Plate 24 is bolted or otherwise mounted on the underside of the upper press platen 12. It will thus be seen that pins 20 extend downwardly from the upper platen 12, the end portions 25 thereof being shaped to conform to the contour of the countersink of the holes or apertures in the insulating member. As herein illustrated, end portions 25 of pins 20 are semispherically shaped, as the countersunk lands are typically of a circular configuration.

Alternatively, with particular reference to FIGURE 2 of the drawings, where the countersunk lands of the holes or apertures in an insulating base member are of a generally circular configuration, the means for printing a conductive or catalytic ink thereon may comprise balls 30 such, for example, as ball bearings. Panel sections 22, 32 of the respective embodiments comprise a rubber blanket member mounted onto the underside of upper press platen 12. In this case ball bearings 30 are attached thereto by means of a two-sided pressure sensitive tape 34.

In either embodiment, the balls or pins are coated with the conductive or catalytic ink by placing a quantity thereof in a container on the bottom platen and lowering the upper press platen until the balls or pins contact the ink. The platen is then raised and the balls or pins are ready to print the ink onto an insulating member.

An insulating member 40 which is to be formed into a printed circuit member, having a plurality of holes or apertures 42 therein, in prearranged relationship to conform to the desired conductive pattern to be deposited on the surface or surfaces of the insulating member, is placed on the bottom platen in a predetermined position so that the holes or apertures are directly beneath and substantially aligned with the printing members extending from the upper platen 12. To aid in this positioning, guide means, such as pins (not shown), may be mounted on the bottom platen and corresponding holes may be punched or pierced in the insulating member.

With reference to the foregoing description, a typical operation of the method and apparatus of the invention is as follows:

A plurality of balls, or pins whose extending end portions are shaped to conform to the contour of a countersink, are mounted on the underside of an upper press platen in a prearranged relationship substantially corresponding to the relationship of the holes or apertures in the insulating member, the countersunk portions of which are to be printed.

A plate or container having a quantity of conductive or catalytic ink therein is placed on the bottom platen and the upper press platen lowered until the balls or pins contact the plate and are coated with the ink. The plate or container is then removed, and an insulating member having a plurality of holes or apertures therein in prearranged relationship to conform to the desired conductive pattern on the insulating member is placed on the bottom platen so that the holes or apertures are substantially in alignment with the balls or pins. The ink is then printed on the countersunk lands in each of the holes or apertures by lowering the upper press platen until the balls or pins contact the countersunk surfaces, as illustrated at 44 in FIGURE 3 of the drawings.

After the countersunk lands of the holes or apertures have been printed with the ink, the insulating member is provided with, or is prepared for providing, electrical connection to and from the printed circuit pattern including electrical connection to external circuit components and/or electrical power sources, and/or other printed circuit patterns.

Typical of the conductive or catalytic inks which may be utilized in accordance with the invention are those catalytic adhesive resinous inks described in copending United States patent application, Serial Number 218,656, filed August 22, 1962, which application is expressly incorporated herein by reference.

The term "catalytic" as used herein refers to surfaces or particles which are capable of receiving a metallic deposit when contacted with, as by immersion, an electroless metal bath.

The term "conductive" as used herein refers to surfaces or particles which conduct electricity. For example, a conductive ink is an ink containing finely divided particles of a conductive material so arranged that the ink itself is electrically conducting.

As described in the copending application, certain of the catalytic resinous inks may be suitablly treated to render them more catalytic, for example, when the catalytic agent incorporated in the ink is finely divided cuprous oxide particles the catalytic ink is preferably subjected to a reducing medium such as acid, e.g., sulfuric acid, to convert at least a portion of the cuprous oxide particles to copper.

As also brought out in the identified copending application, catalytic inks, following treatment if necessary, may be readily rendered conductive or may be coated with a conductive metal by contact, as by immersion, with an electroless metal deposition bath to electrolessly or autocatalytically deposit metal thereon. Suitable electroless metal deposition baths are described in the identified copending application and typically comprise a water soluble metal salt, for example, copper sulfate; a reducing agent for the metal salt, for example, formaldehyde, alkali borohydride and the like, and a complexing agent for the metallic ion. Preferably, the bath will also contain a water soluble cyanide compound to render the electroless metal deposit ductile.

The invention in its broader aspects is not limited to the specific embodiments or processes herein shown and described but departures may be made therefrom within the scope of the accompanying claims, without departing from the principles of the invention and without sacrificing its chief advantages.

What is claimed is:

1. In the manufacture of a printed circuit board, a method for simultaneously depositing ink on the peripheral edges of a plurality of holes arranged in the insulating base member of said printed circuit board in a substantially predetermined relationship, comprising: providing a plurality of rigid printing members with end portions shaped to conform to the peripheral contour of said holes, mounting each of said printing members directly onto a flexible, resilient backing support in a predetermined relationship substantially corresponding to that of said holes in said base member, coating the end portions of said printing members with the ink to be deposited, initially contacting said printing members with said insulating base member in substantial alignment with said holes, and thereafter moving said printing members into direct alignment with said holes, whereby said ink is transferred uniformly and simultaneously from said printing members onto the peripheral contour of each of said plurality of holes.

2. Apparatus for use in the manufacture of a printed circuit board for simultaneously depositing ink on the peripheral edges of a plurality of holes arranged in the insulating base member of said printed circuit board in substantially predetermined relationship, comprising, in combination: a movable base, a flexible, resilient material attached to said base, means mounting a plurality of rigid printing members whose extending end portions are coated with the ink to be deposited directly onto said flexible, resilient material so as to permit individual movement of said printing members in both a lateral and vertical direction, said printing members being arranged on said base in a predetermined relationship substantially corresponding to that of the holes in the insulating member of the printed circuit board, and means for moving said base so that said printing members initially contact said insulating base member in substantial alignment with said holes and thereafter move into direct alignment with said holes, whereby ink is uniformly and simultaneously deposited on the peripheral edges of said plurality of holes.

3. Apparatus for use in the manufacture of a printed circuit board for depositing ink on at least a portion of the surfaces surrounding each of a plurality of holes arranged in the insulating base member of said printed circuit board in substantially predetermined relationship, comprising, in combination: a bellows press having an upper platen member and a bottom platen member, the underside of said upper platen member having a flexible, resilient material attached thereto, means mounting a plurality of rigid printing members whose extending end portions are coated with ink individually in direct contact with said flexible, resilient material of said upper press platen so as to permit individual movement of said printing members in both a lateral and vertical direction, said bottom platen member adapted to receive said insulating base member, and guide means on said bottom platen member for substantially aligning the holes of said insulating member with said printing members, whereby upon lowering said upper press platen said printing members initially contact said insulating member in substantial alignment with said holes and thereafter move into direct alignment with said holes, thereby uniformly and simultaneously depositing said ink on the surfaces surrounding said holes.

4. Apparatus as claimed in claim 3 wherein said surfaces surrounding said holes are countersunk and of generally circular configuration and wherein said printing members are spherically-shaped.

5. Apparatus as claimed in claim 4 wherein said spherically-shaped means comprise cylindrical pin members having semi-spherically shaped end portions.

6. Apparatus as claimed in claim 4 wherein said spherically-shaped means comprise ball bearings.

References Cited by the Examiner

UNITED STATES PATENTS

| | | | |
|---|---|---|---|
| 451,978 | 5/1891 | Rott | 101—41 |
| 729,699 | 6/1903 | Test | 101—379 |
| 1,773,887 | 8/1930 | Stirling. | |
| 1,993,806 | 3/1935 | Putman | 101—426 X |
| 2,493,953 | 1/1950 | Emerson | 101—41 |
| 2,748,696 | 6/1956 | Murray | 101—41 |
| 3,108,537 | 10/1963 | Way et al. | 101—41 X |
| 3,158,503 | 11/1964 | Young | 117—212 |
| 3,171,756 | 3/1965 | Marshall | 117—212 |

ROBERT E. PULFREY, *Primary Examiner.*

W. McCARTHY, *Assistant Examiner.*